United States Patent
Gao et al.

(10) Patent No.: US 9,935,012 B1
(45) Date of Patent: Apr. 3, 2018

(54) METHODS FOR FORMING DIFFERENT SHAPES IN DIFFERENT REGIONS OF THE SAME LAYER

(71) Applicant: GLOBALFOUNDRIES INC., Grand Cayman (KY)

(72) Inventors: Jinsheng Gao, Ballston Spa, NY (US); Haigou Huang, Rexford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/361,824

(22) Filed: Nov. 28, 2016

(51) Int. Cl.
| | |
|---|---|
| *H01L 21/336* | (2006.01) |
| *H01L 21/8234* | (2006.01) |
| *H01L 29/66* | (2006.01) |
| *H01L 21/027* | (2006.01) |
| *H01L 21/308* | (2006.01) |
| *H01L 29/16* | (2006.01) |
| *H01L 21/02* | (2006.01) |

(52) U.S. Cl.
CPC .. *H01L 21/823431* (2013.01); *H01L 21/0274* (2013.01); *H01L 21/02115* (2013.01); *H01L 21/02118* (2013.01); *H01L 21/3081* (2013.01); *H01L 29/16* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,541,397 B1 | 4/2003 | Bencher | |
| 6,867,125 B2 | 3/2005 | Kloster et al. | |
| 7,537,682 B2 | 5/2009 | Dailly et al. | |
| 7,972,653 B2 | 7/2011 | Tachikawa et al. | |
| 8,871,108 B2 | 10/2014 | Lauerhaas | |
| 2013/0189845 A1 | 7/2013 | Kim et al. | |
| 2014/0148012 A1* | 5/2014 | Guillorn | H01L 21/3086 438/700 |
| 2015/0236133 A1* | 8/2015 | Singh | H01L 29/66795 257/401 |
| 2017/0213767 A1* | 7/2017 | Sung | H01L 21/82343 |

* cited by examiner

*Primary Examiner* — Bradley K Smith
(74) *Attorney, Agent, or Firm* — Gibb & Riley, LLC; Francois Pagette

(57) ABSTRACT

Disclosed are methods of forming different shapes in different regions of a specific layer. In the methods, a first mask layer and an etch process are used to form first shapes in a first region. Subsequently, a second mask layer and additional etch process(es) are used to form second shapes in a second region. However, before the second shapes are formed, a sacrificial layer of a degradable material is deposited onto the first mask layer and within openings in the specific layer surrounding the first shapes, thereby protecting the first shapes during formation of the second shapes. After the second shapes are formed, the material of the sacrificial layer is degraded (e.g., oxidized, volatilized, burned-off, etc.) so as to selectively remove that material from surfaces of the first mask layer and the specific layer without impacting the profiles of either the first shapes or the second shapes.

20 Claims, 15 Drawing Sheets

METHODS FOR FORMING DIFFERENT SHAPES IN DIFFERENT REGIONS OF THE SAME LAYER

FIELD OF THE INVENTION

The present invention relates to integrated circuit (IC) manufacturing and, more specifically, to methods for forming different patterns of shapes in different regions of the same layer of an IC.

BACKGROUND

Oftentimes, during integrated circuit (IC) manufacturing, different regions of the same layer are patterned differently and, particularly, patterned with shapes having different widths and/or different pitches. For example, different regions of a polycrystalline semiconductor layer (e.g., a polysilicon or other suitable polycrystalline semiconductor layer) may be patterned with relatively thick gate structures having a first pitch for long channel field effect transistors (FETs), with relatively thin gate structures having a second pitch for short channel FETs, etc. Similarly, different regions of a monocrystalline semiconductor layer (e.g., a silicon layer or other suitable monocrystalline semiconductor layer) may be patterned with relatively thick semiconductor fins having a first pitch for tri-gate FETs, with relatively thin semiconductor fins having a second pitch for dual-gate FETs (also referred to herein as fin-type FETs or finFETs), with planar semiconductor bodies for planar FETs, etc. It should be understood that these examples are not intended to be limiting and, during IC manufacturing, different regions of other material layers (e.g., dielectric layers, metal layers, etc.) may also be patterned differently. In any case, currently used techniques for forming different patterns of shapes in different regions of the same layer, respectively, can result in the patterned shapes in at least one of the different regions having profiles that are less than optimal.

SUMMARY

In view of the foregoing, disclosed herein are improved methods of forming different shapes in different regions of the same specific layer during integrated circuit (IC) manufacturing. In the methods, a first mask layer and etch process can be used to form first shapes in a first region of the specific layer. Subsequently, a second mask layer and at least one additional etch process can be used to form second shapes in a second region of the specific layer. However, before the second shapes are formed, a sacrificial layer of a degradable material can be deposited onto the first mask layer and within openings in the specific layer surrounding the first shapes in order to protect the first shapes during formation of the second shapes. Then, after the second shapes are formed, a process can be initiated to degrade the material of the sacrificial layer (e.g., to oxidize, volatilize, burn-off or otherwise degrade the material) so as to selectively remove that material from surfaces of the first mask layer and the specific layer without impacting the profiles of either the first shapes or the second shapes. By using separate masks and separate etch processes to separately form the first shapes and the second shapes, the methods allow the parameters of the etch processes to be uniquely tailored so that, when formed, both the first shapes and the second shapes will have the desired profiles.

Generally, the methods include forming a first mask layer on a specific layer to be patterned. This first mask layer can have a first patterned portion, which is aligned over a first region of the specific layer, and a first protective portion, which is aligned over a second region of the specific layer. An etch process can then be performed using the first mask layer to create first shapes within the first region of the specific layer and to leave the second region intact. A sacrificial layer made of a degradable material can be deposited over the first mask layer such that openings, which were created in the first region of the specific layer as a result of the first etch process, are filled-in. Then, a second mask layer can be formed on the sacrificial layer. The second mask layer can have a second patterned portion, which is aligned over the second region of the specific layer, and a second protective portion, which is aligned over the first region. After the second mask layer is formed, at least one additional etch process can be performed using the second mask layer to create second shapes within the second region of the specific layer. Subsequently, a process can be performed to degrade the degradable material (e.g., to oxidize, volatilize, burn-off or otherwise degrade the degradable material), thereby selectively removing the sacrificial layer from above the first mask layer and from within the openings without impacting the profiles of either the first shapes or the second shapes.

One embodiment of the method includes using a lithographic process to form a first mask layer on a semiconductor layer to be patterned. This first mask layer can have a first patterned portion, which is aligned over a first region of the specific layer, and a first protective portion, which is aligned over a second region of the specific layer. An etch process can then be performed using the first mask layer to create first shapes within the first region of the specific layer and to leave the second region intact. A sacrificial layer made of a degradable material can be deposited over the first mask layer such that openings, which were created in the first region of the specific layer as a result of the first etch process, are filled-in. Then, a second mask layer can be formed on the sacrificial layer using a sidewall image transfer process. The second mask layer can have a second patterned portion, which is aligned over the second region of the specific layer, and a second protective portion, which is aligned over the first region. After the second mask layer is formed, at least one additional etch process can be performed using the second mask layer to create second shapes within the second region of the specific layer. Subsequently, a process can be performed to degrade the degradable material (e.g., to oxidize, volatilize, burn-off or otherwise degrade the degradable material), thereby selectively removing the sacrificial layer from above the first mask layer and from within the openings without impacting the profiles of the first shapes or the second shapes.

Another, more particular, embodiment of the method includes using a lithographic process to form a first mask layer on a semiconductor layer to be patterned. This first mask layer can have a first patterned portion, which is aligned over a first region of the semiconductor layer, and a first protective portion, which is aligned over a second region of the semiconductor layer. An etch process can then be performed using the first mask layer to create first shapes within the first region of the specific layer and to leave the second region intact. A sacrificial layer made of a degradable material and, particularly, amorphous carbon can be deposited over the first mask layer such that openings, which were created in the first region of the semiconductor layer as a result of the first etch process, are filled-in. Then, a second mask layer and, particularly, an amorphous silicon mask can be formed on the sacrificial layer using a sidewall image transfer process. The second mask layer can have a second patterned portion, which is aligned over the second region of the semiconductor layer, and a second protective portion, which is aligned over the first region. After the second mask layer is formed, additional etch processes can be performed using the second mask layer to etch through the sacrificial layer, through the first mask layer and into the semiconductor layer in order to create second shapes within the second region of the semiconductor layer. Subsequently, a process can be performed to degrade the degradable material (e.g., to oxidize, volatilize, burn-off or otherwise degrade the degradable material), thereby selectively removing the sacrificial layer from above the first mask layer and from within the openings without impacting the profiles of the either the first shapes or the second shapes.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, currently used techniques for forming different patterns of shapes in different regions of the same layer, respectively, can result in the patterned shapes in at least one of the different regions having profiles that are less than optimal. Specifically, to form different patterns of shapes in different regions of a specific layer, the following processes are typically performed. A hardmask layer is deposited onto the specific layer to be patterned. Then, discrete lithographic patterning and etch processes are used to form different patterns in different regions of the hardmask layer. Once the hardmask layer is fully patterned, a single etch process is used to transfer the different patterns from the hardmask layer into the specific layer below. However, this technique of using a single etch process to transfer all the different patterns from the hardmask layer into the specific layer can cause the shapes that are formed in at least one of the regions to have less than optimal profiles. Specifically, the sidewalls of thicker shapes (e.g., thicker gate structures or thicker semiconductor fins) with a wider pitch may not be vertical. Instead, due to the loading effect (i.e., due to the dependence of the etch rate on the quantity of material being etched), the thicker shapes with the wider pitch may have a bulging lower portion (i.e., may have a relatively wide lower portion and a relatively narrow upper portion). Patterned shapes having non-optimal profiles may negatively impact device parameters. For example, a wider than desired gate structure may result in a longer than desired channel length and a wider than desired semiconductor fin may result in a wider than desired channel width. Additionally, patterned shapes having non-optimal profiles can also negatively impact downstream fabrication processes. For example, when epitaxial semiconductor material is grown to form raised source/drain regions on a semiconductor body (e.g., on a planar semiconductor body or on a semiconductor fin) adjacent to a gate structure that has a bulging lower portion, undesirable bulging of the epitaxial semiconductor material can also occur.

In view of the foregoing, disclosed herein are improved methods of forming an integrated circuit (IC) structure with different shapes in different regions, respectively, of the same specific layer during integrated circuit (IC) manufacturing.

Figure 1:
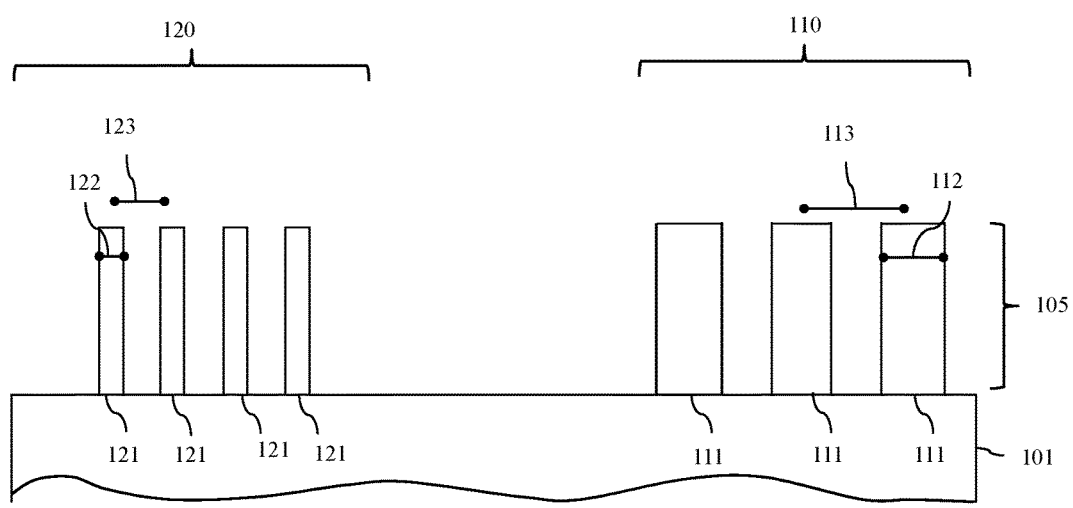
FIG. 1 is a cross-section diagram illustrating a partially completed IC structure having a specific layer patterned with different shapes in different regions, respectively.

FIG. 1 is a cross-section illustration of a partially completed IC structure having a specific layer 105 that is patterned with different shapes in different regions 110, 120, respectively. Specifically, the specific layer 105 is above a substrate 101 and includes a first region 110 having first shapes 111 and a second region 120 having second shapes 121. The first shapes 111 and the second shapes 121 can, for example, be relatively narrow, elongated, rectangular-shaped bodies (also referred to as fin-shaped bodies), as illustrated, or any other patternable shape. The first shapes 111 can have a first width 112 and the second shapes 121 can have a second width 122 that is different from the first width 112. For example, the first shapes 111 can be relatively thick as compared to the second shapes 121 (i.e., the first width 112 can be greater than the second width 122). Additionally or alternatively, the first shapes 111 can have a first pitch 113 and the second shapes 121 can have a second pitch 123 that is different from the first pitch 113. For example, the first pitch 113 can be greater than the second pitch 123. For purpose of this disclosure, "pitch" refers to the center-to-center distance between adjacent shapes.

The specific layer 105 can be, for example, a semiconductor layer, a dielectric layer, a metal layer or any other type of material layer used in integrated circuit (IC) manufacturing and requiring patterning.

Figure 2A:
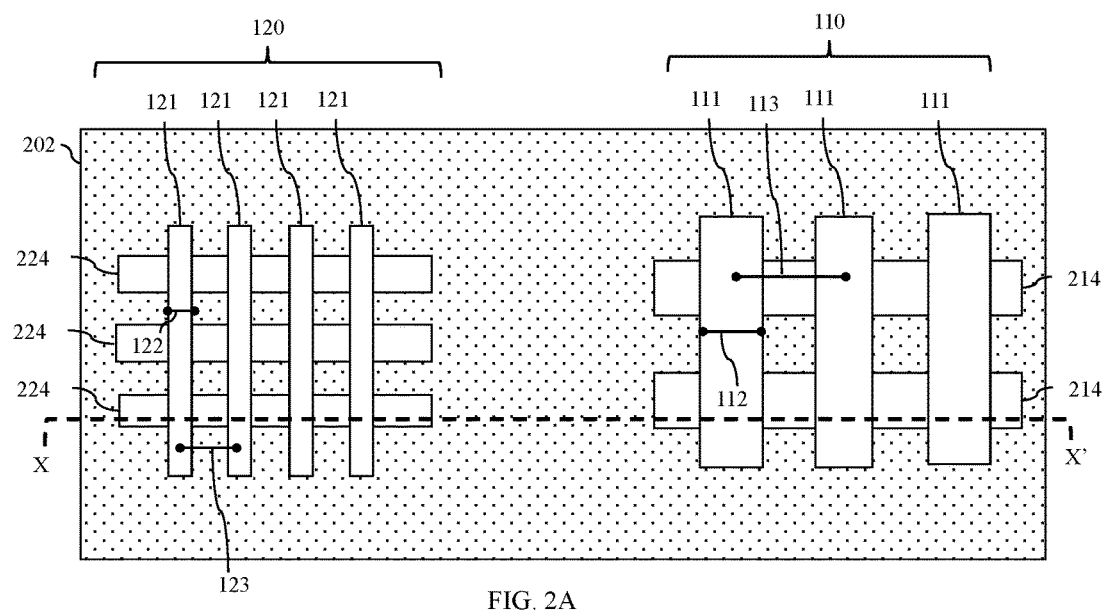
FIGS. 2A-2B are top view and cross-section diagrams illustrating the specific layer of FIG. 1 as a layer of gate material patterned with different shaped gates in different regions, respectively.
Figure 2B:
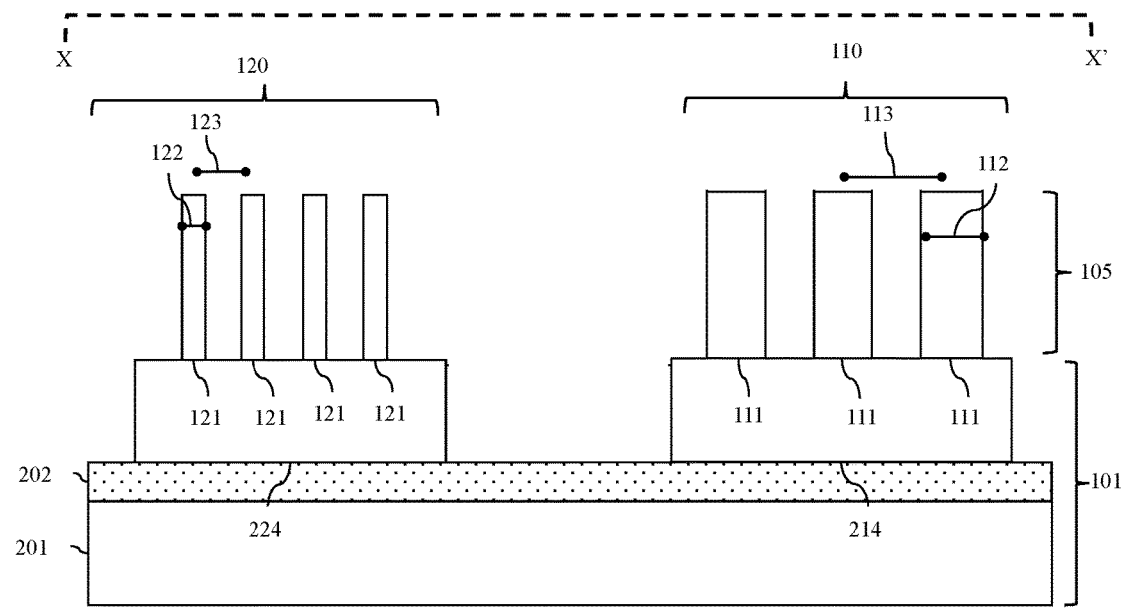

In one example, as illustrated in the top view and cross-section diagrams of FIGS. 2A and 2B, the specific layer 105 can be a layer of gate material. The gate material can be a gate conductor material suitable for use in final gate structures formed according to gate-first processing techniques. For example, the gate material can be a polycrystalline semiconductor material (e.g., polysilicon). Alternatively, the gate material can be a sacrificial gate material suitable for use in dummy gate structures formed according to replacement metal gate (RMG) processing techniques. For example, the gate material can be a polycrystalline semiconductor material (e.g., silicon), a dielectric material (e.g., silicon nitride), or any other suitable sacrificial gate material). Regardless of the type of gate material, the first shapes 111 can be first gate structures for one or more first FETs (e.g., long channel FETs) and the second shapes 121 can be second gate structures for one or more second FETs (e.g., short channel FETs). In any case, when the specific layer 105 is a layer of gate material, the substrate 101 can include one or more first semiconductor bodies 214 for the first FET(s) and one or more second semiconductor bodies 224 for the second FET(s). These semiconductor bodies 214, 224 can be patterned into the semiconductor layer of a semiconductor-on-insulator (SOI) wafer (i.e., into a semiconductor layer that is on an insulator layer 202 above a semiconductor substrate 201), as illustrated. Alternatively, these semiconductor bodies 214, 224 can be patterned into the upper portion of a bulk semiconductor wafer. In any case, the semiconductor bodies 214, 224 can be semiconductor fins for non-planar FETs (e.g., for dual-gate or tri-gate FETs), as illustrated, or planar semiconductor bodies for planar FETs and the first gate structures (i.e., the first shapes 111) can be positioned adjacent to channel regions within the first semiconductor body(ies) 214 and the second gate structures (i.e., the second shapes 121) can be positioned adjacent to channel regions within the second semiconductor body(ies) 224. Those skilled in the art will recognize that, for a non-planar FET, a gate structure will be positioned adjacent to the opposing sides and, optionally, the top surface of at least one semiconductor body; whereas, for a planar FET, a gate structure will be positioned adjacent to the top surface only of at least one semiconductor body.

Figure 3A:
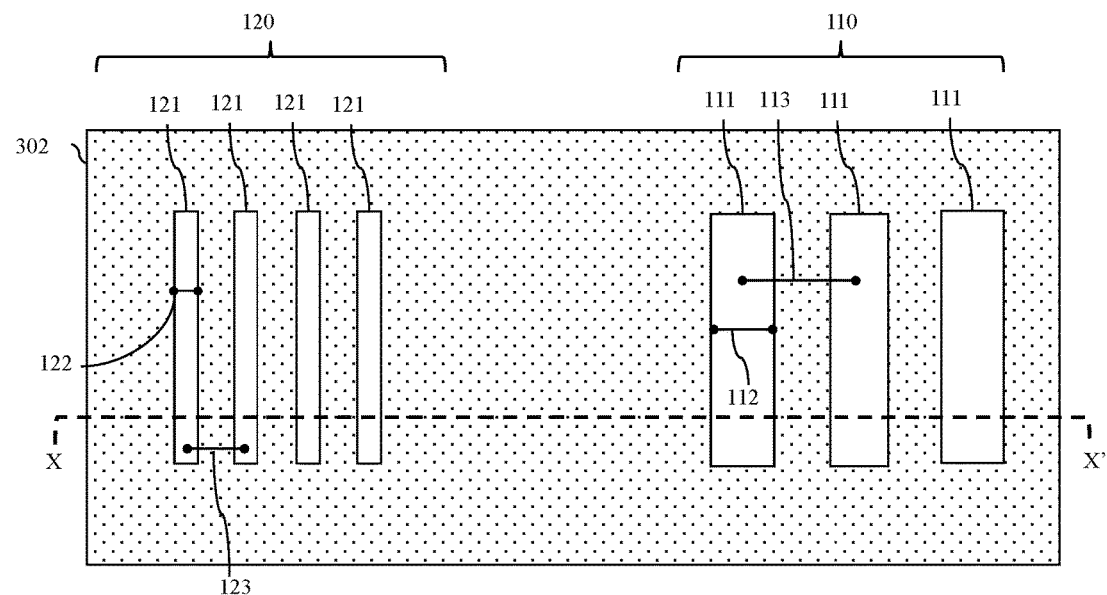
FIGS. 3A-3B are top view and cross-section diagrams illustrating the specific layer of FIG. 1 as a layer of semiconductor material patterned with different shaped semiconductor bodies in different regions, respectively.
Figure 3B:
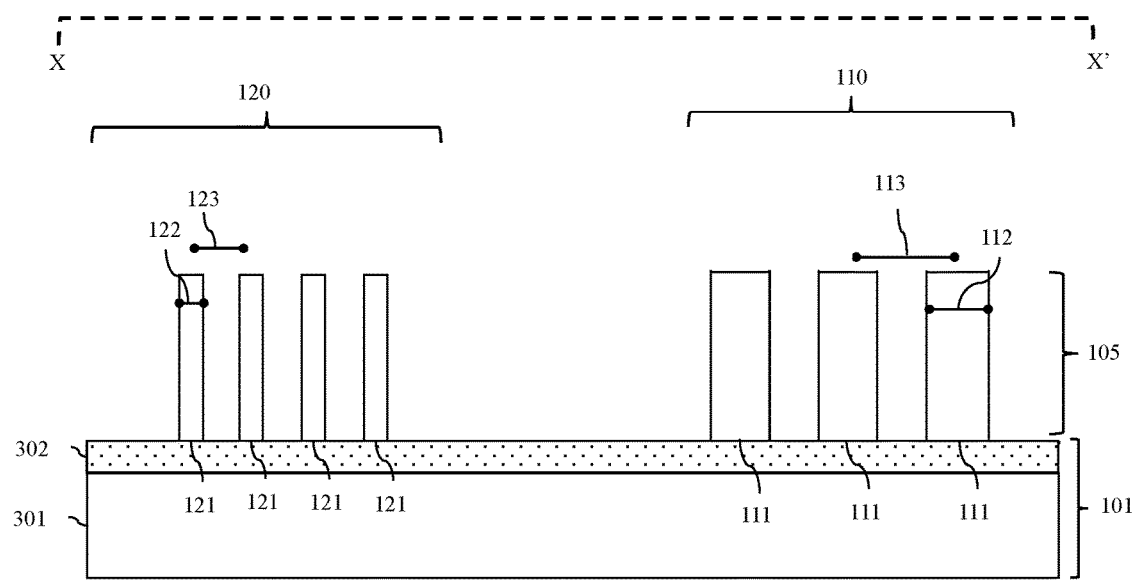

In yet another example, as illustrated in the top view and cross-section diagrams of FIGS. 3A and 3B, the specific layer 105 can be a monocrystalline semiconductor layer (e.g., a silicon layer or other suitable monocrystalline semiconductor layer). The first shapes 111 can be first semiconductor fins (e.g., first silicon fins) for one or more non-planar first FETs and the second shapes 121 can be second semiconductor fins (e.g., second silicon fins) for one or more non-planar second FETs. The specific layer 105 can be, for example, a monocrystalline semiconductor layer of a semiconductor-on-insulator (SOI) wafer and the substrate 101 can include the insulator layer 302 and semiconductor substrate 301 below, as illustrated. Alternatively, the monocrystalline semiconductor layer can be an upper portion of a bulk semiconductor wafer and the substrate 101 can be a lower portion of the same bulk semiconductor substrate.

Figure 4:
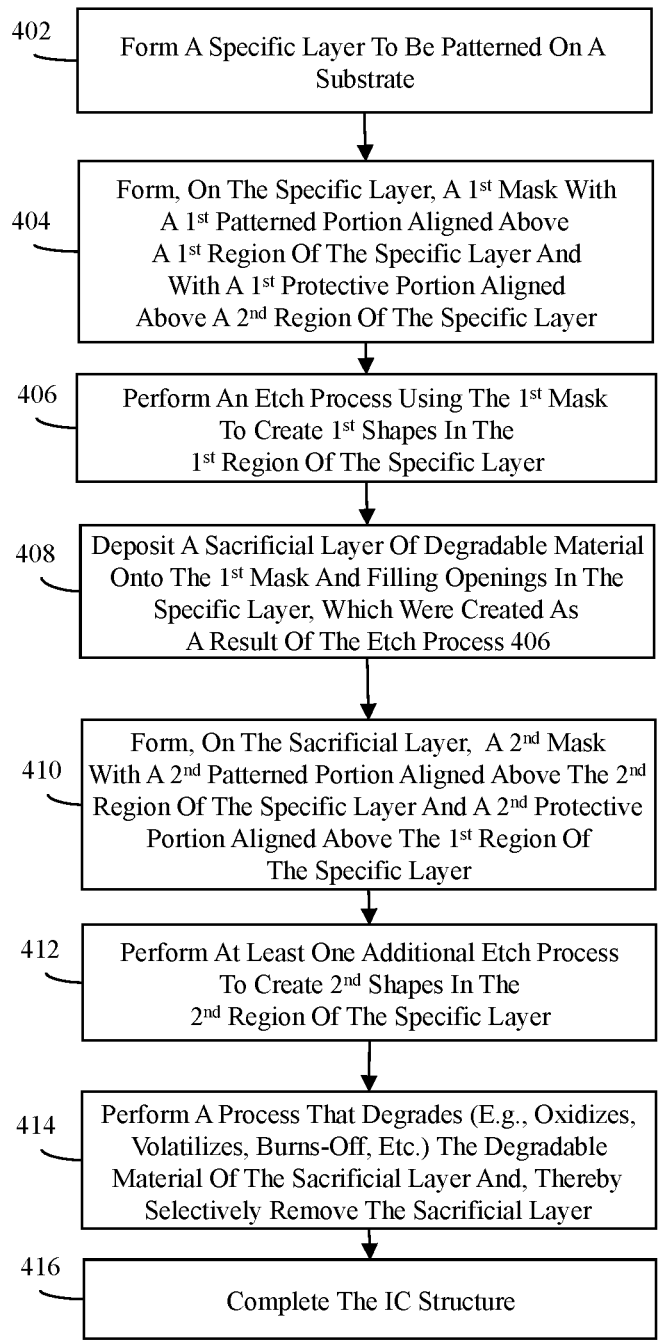
FIG. 4 is a flow diagram illustrating methods of patterning a specific layer with different shapes in different regions, respectively; and, FIGS. 5-18 are cross-section diagrams illustrating a partially completed IC structures formed according to the methods of FIG. 4.

FIG. 4 is a flow diagram illustrating the disclosed methods of forming the different shapes 111 and 121 in the different regions 110 and 120 of the specific layer 105 in such a way as to ensure that the desired profiles for both the shapes 111 and 121 can be achieved (i.e., to ensure that the first shapes 111 and the second shapes 121 each have essentially vertical sidewalls, as illustrated, with little to no bulging).

Figure 5:
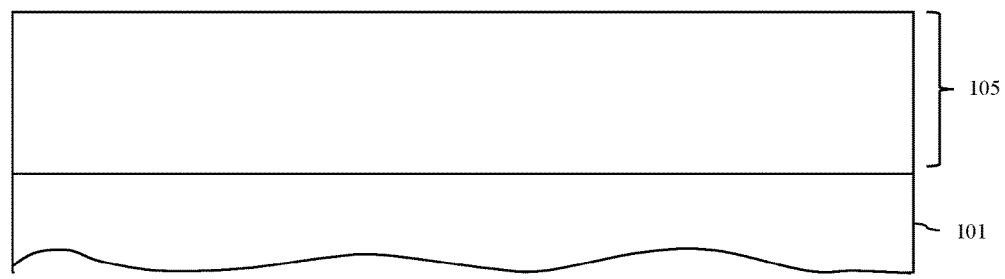

The methods include forming a specific layer 105 to be patterned above a substrate 101 (402, see FIG. 5). As mentioned above, the specific layer 105 can be a gate material layer (e.g., a gate first gate material layer or a sacrificial gate material layer) to be patterned into gate structures, as shown in FIGS. 2A-2B. Exemplary gate material includes a polycrystalline semiconductor layer (e.g., a polysilicon layer). Alternatively, the specific layer 105 can be a monocrystalline semiconductor layer (e.g., a silicon layer) to be patterned into semiconductor bodies, as shown in FIGS. 3A-3B. Alternatively, the specific layer 105 can be any other type of material layer (e.g., a dielectric layer, a metal layer, etc.) to be patterned for used in an integrated circuit (IC) structure.

Figure 6:
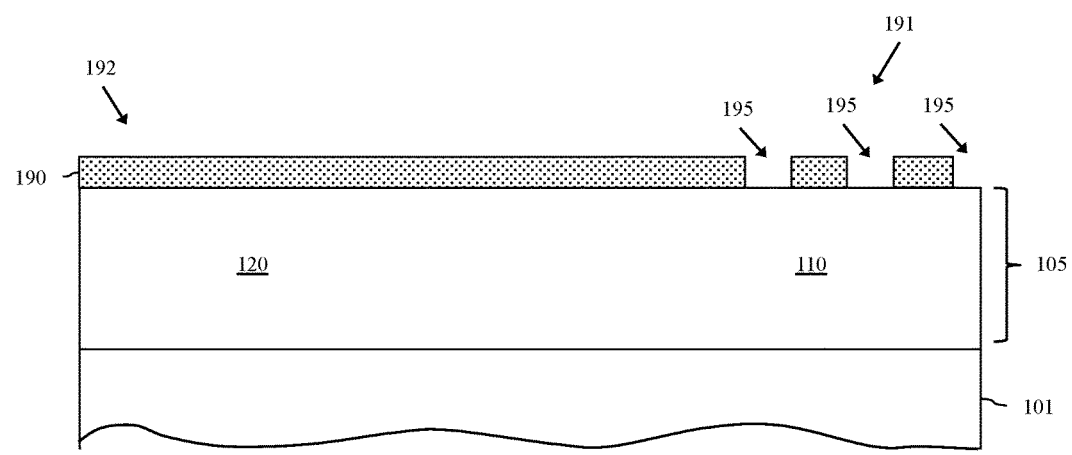

A first mask layer 190 can be formed on the specific layer 105 and can be patterned so as to have both a first patterned portion 191, which has a plurality of openings and which is aligned over a first region 110 of the specific layer 105, and a first protective portion 192, which is solid (i.e., devoid of openings) and which is aligned over a second region 120 of the specific layer 105 (404, see FIG. 6). This first mask layer 190 can be, for example, a dielectric layer (e.g., a silicon nitride mask layer or any other suitable dielectric layer). The first patterned portion 191 can specifically be patterned for use in forming the first shapes 111 in the first region 110 of the specific layer 105, as shown in FIG. 1.

Since the first shapes 111 are to be relatively thick (i.e., are to have a first width 112 that is greater than the second width 122 of the second shapes 121) and/or are to have a relatively long pitch (i.e., a first pitch 113 that is longer than a second pitch 123 of the second shapes 121), one exemplary patterning technique that could be used at process 404 to pattern the first mask layer 190 is a lithographic patterning technique. Specifically, after the first mask layer 190 is formed on the specific layer 105, a photoresist layer (e.g., a positive tone photoresist layer or a negative tone photoresist layer) can be formed on the first mask layer 190. Subsequently, an exposure process can be performed. During the exposure process, a reticle can be placed relative to a light source and the photoresist layer so that portions of the photoresist layer can be exposed to light, which is either transmitted through the reticle (e.g., in the case of conventional photolithography) or reflected off of the reticle (e.g., in the case of extreme ultraviolet (EUV) photolithography). Exposure to light in this manner can cause a chemical change in exposed areas of the photoresist layer as compared to unexposed areas. Following the exposure process, a development process can be performed. During the development process, the structure is placed in a development solution. In the case of a positive tone photoresist layer, the exposed areas will be soluble in the development solution, thereby forming openings in the photoresist layer, and the unexposed areas will be insoluble. In the case of a negative tone photoresist layer, the exposed areas will be insoluble in the development solution and the unexposed areas will be soluble, thereby forming openings in the photoresist layer. Subsequently, an anisotropic etch process (e.g., an anisotropic reactive ion etch (RIE) process) can be performed to transfer a pattern of openings 195 from the photoresist layer into the first mask layer 190 and, particularly, into the first patterned portion 191 of the first mask layer 190. Alternatively, any other suitable patterning technique could be used to pattern the first mask layer 190.

Figure 7:
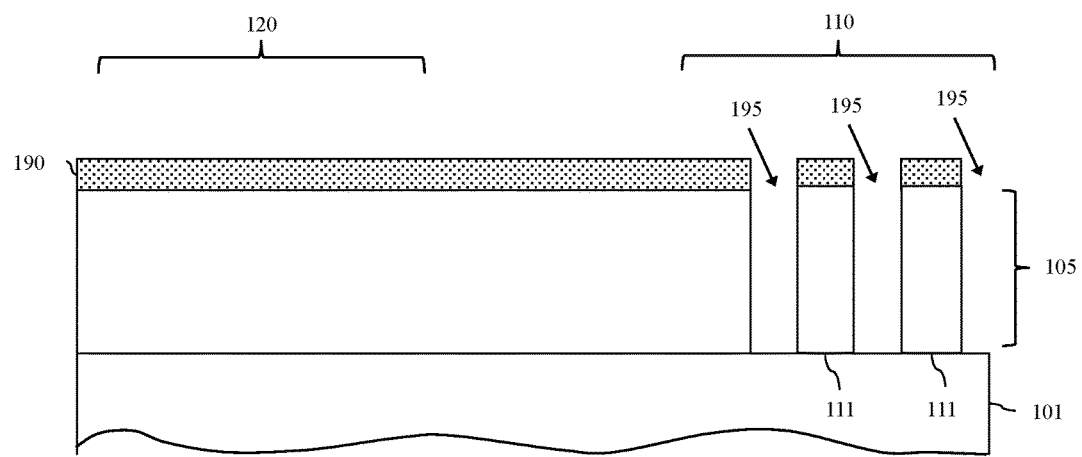

Following formation and patterning of the first mask layer 190 at process 404, an anisotropic etch process (e.g., an anisotropic RIE process) can be performed to transfer the pattern of openings 195 from the first patterned portion 191 of the first mask layer 190 into the first region 110 of the specific layer 105 below (406, see FIG. 7). Thus, using the first mask layer 190 and, particularly, the first patterned portion 191 of the first mask layer 190, first shapes 111 can be created within the first region 110 of the specific layer 105. It should be noted that the first protective portion 192 of the first mask layer 190 protects the second region 120 of the specific layer 105 during process 408 such that the second region 120 remains intact.

Figure 8:
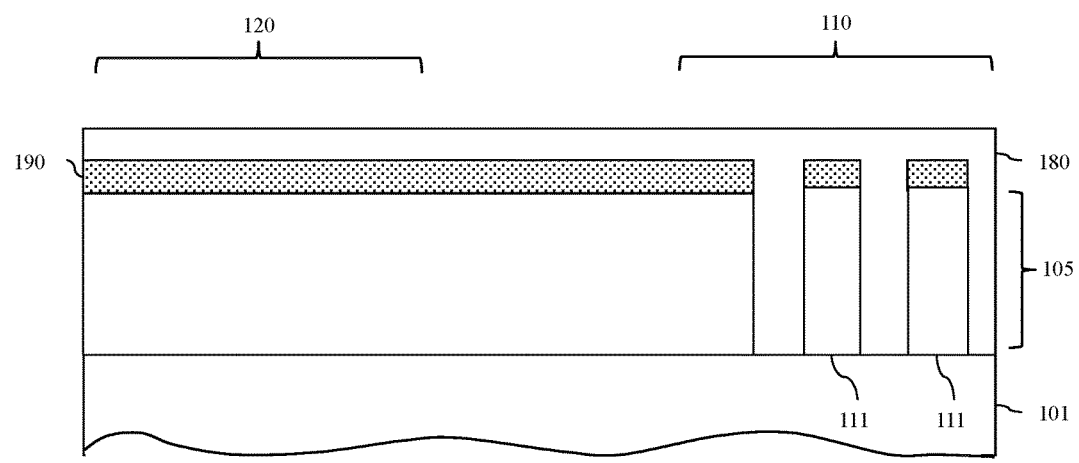

Next, in order to protect the first shapes 111 during subsequent processing, a sacrificial layer 180 made of a degradable material can be deposited over the first mask layer 190 such that the openings 195, which were created in the first region 110 of the specific layer 105 as a result of the previous etch process 406, are filled-in (408, see FIG. 8). The degradable material can be, for example, a thermodegradable material (i.e., a material that degrades at or above a particular temperature), a photodegradable material (i.e., a material that degrades upon exposure to light of a particular wavelength or wavelength range, such as ultraviolet (UV) light) or any other suitable type of degradable material that can degrade (e.g., oxidize, volatilize, burn-off or otherwise degrade) into a gas state under selectively controllable conditions that would not impact the materials of the substrate 101, the specific layer 105 or the first mask layer 190.

One exemplary degradable material that could be used for the sacrificial layer 180 is amorphous carbon. Amorphous carbon can be deposited onto the first mask layer 190 and into the openings 195, for example, by plasma-enhanced chemical vapor deposition (PECVD) or any other suitable deposition technique. It should be noted that amorphous carbon provides the added benefit of having a high hardness that provides support for subsequent processing (e.g., chemical mechanical planarization (CMP)). Other exemplary degradable materials can include, but are not limited to, thermally degradable polymers and photodegradable polymers.

Optionally, once the sacrificial layer 180 is deposited, an oxide layer can be deposited onto the sacrificial layer 180 (e.g., onto the amorphous carbon) using, for example, a high-density plasma (HDP) chemical vapor deposition (CVD) process. This oxide layer can subsequently be polished (e.g., using a chemical mechanical polishing (CMP) process) and removed (e.g., using a non-selective etch (NSE) process) in order to smooth the surface of the sacrificial layer 180 in preparation of further processing.

A second mask layer can then be formed on the sacrificial layer 180 and can be patterned so as to have a second patterned portion, which has a plurality of openings and which is aligned over the second region 120 of the specific layer 105, and a second protective portion, which is solid and which is aligned over the first region 110 of the specific layer 105 (410). The second mask layer formed on the sacrificial layer 180 can be an amorphous silicon mask layer or any other suitable mask layer. The second mask layer and, particularly, the second patterned portion of this second mask layer can be patterned at process 410 for use in forming the second shapes 121 in the second region 120 of the specific layer 105, as shown in FIG. 1.

Figure 9:
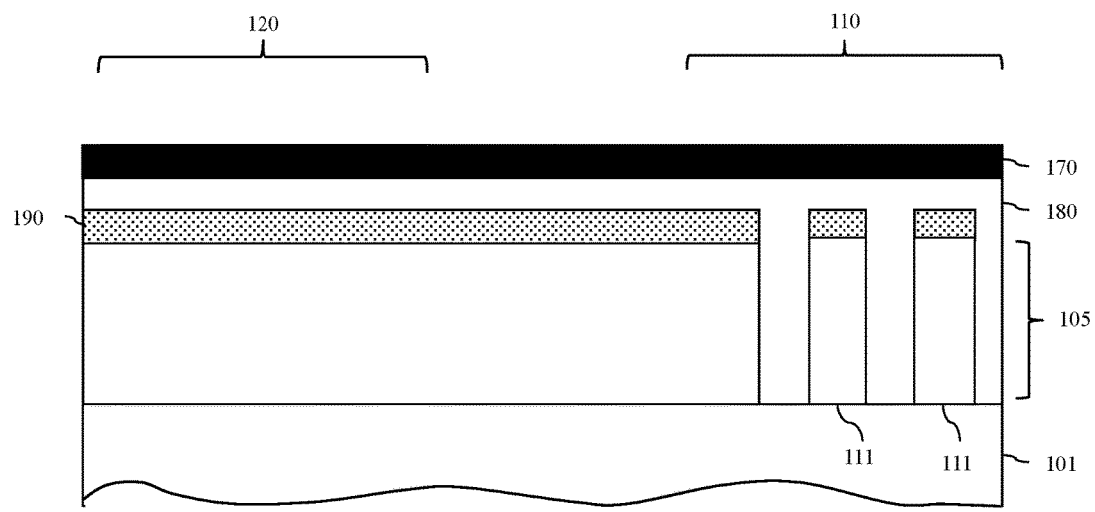
Figure 10:
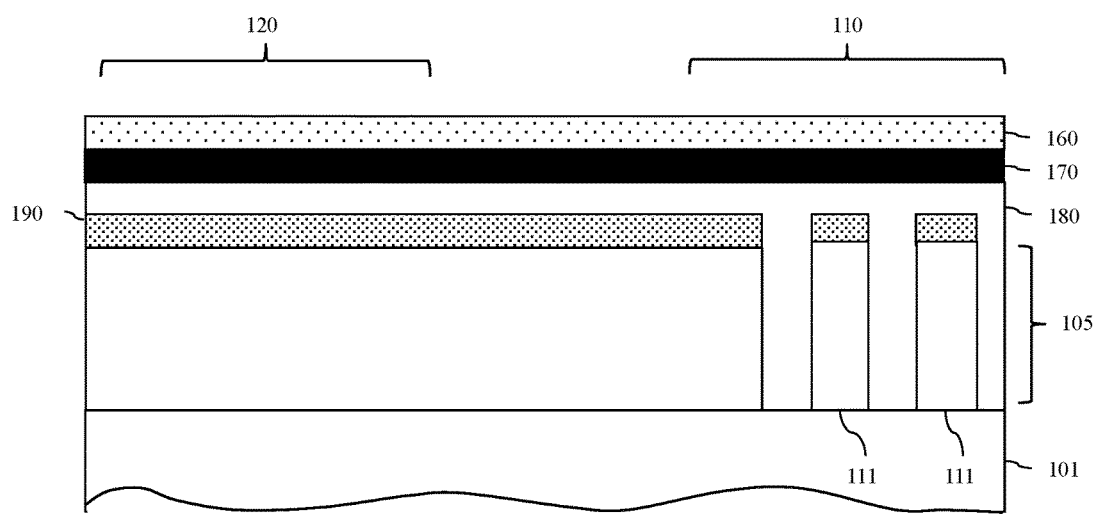
Figure 11:
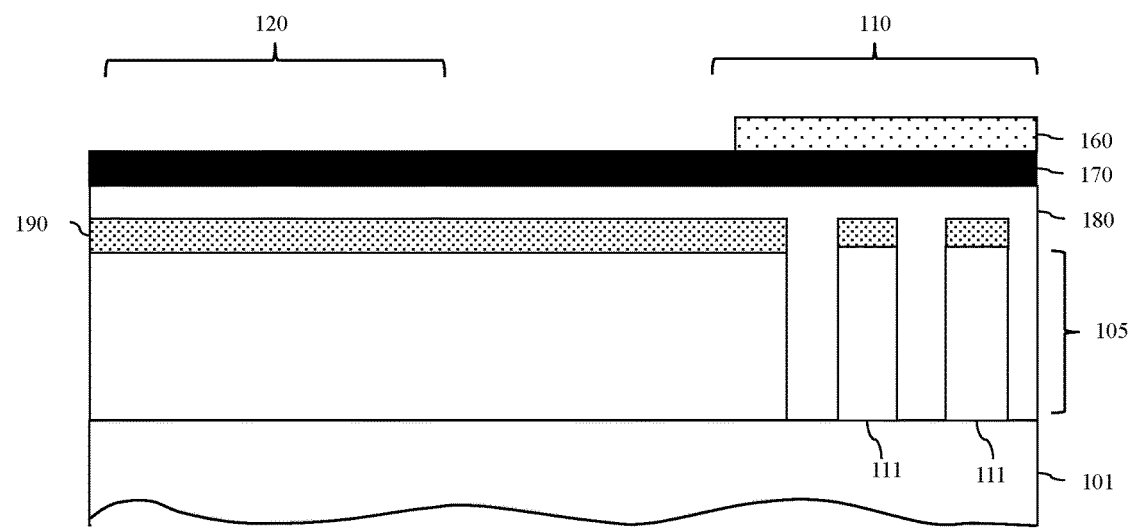
Figure 12:
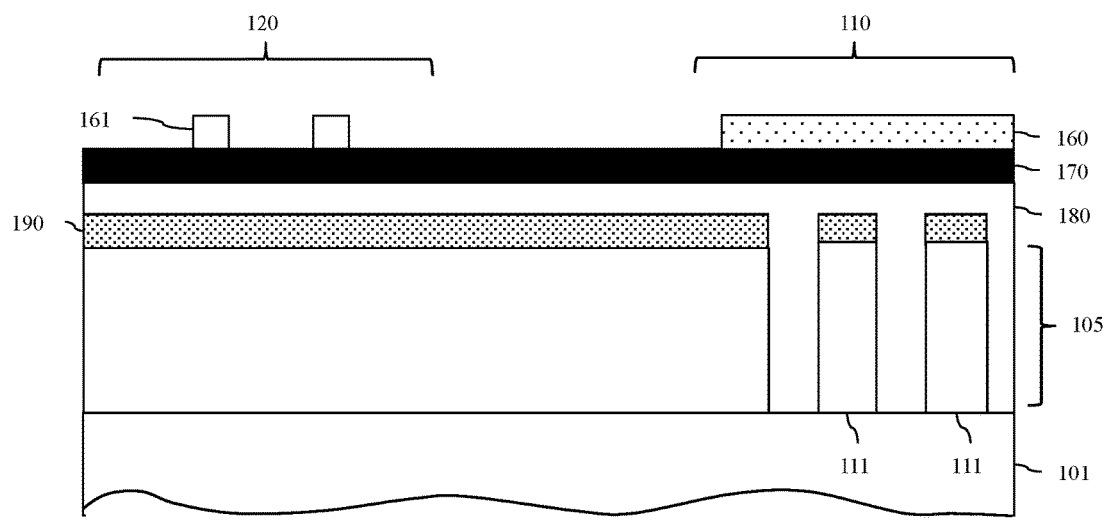
Figure 13:
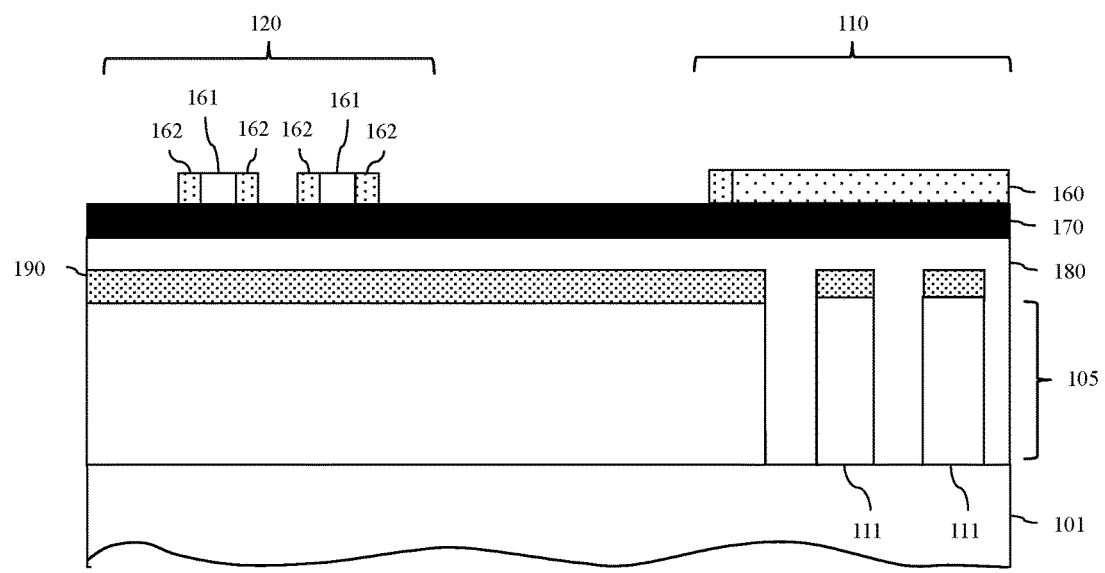
Figure 14:
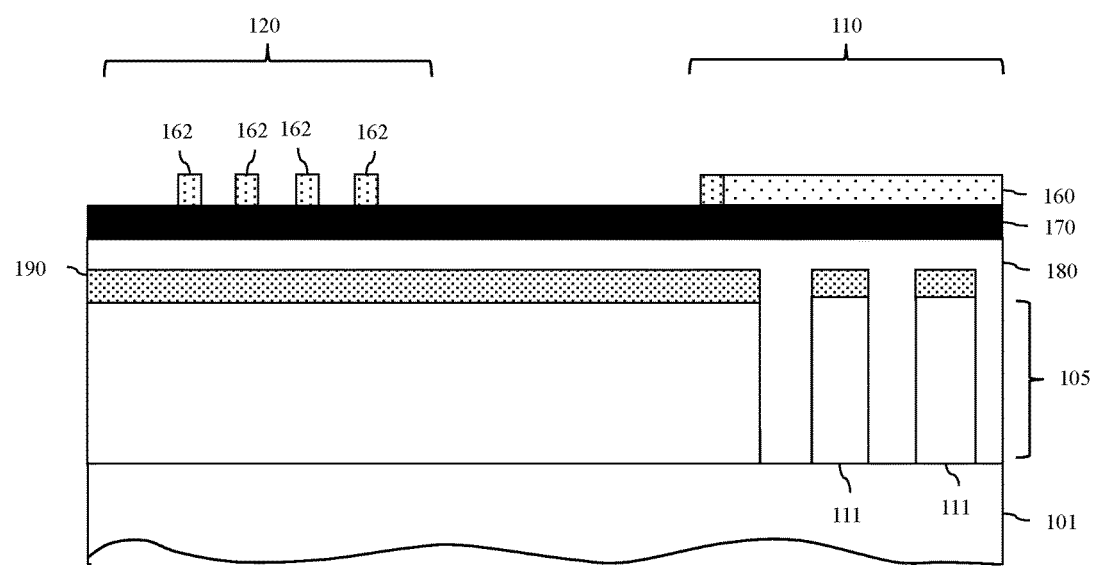
Figure 15:
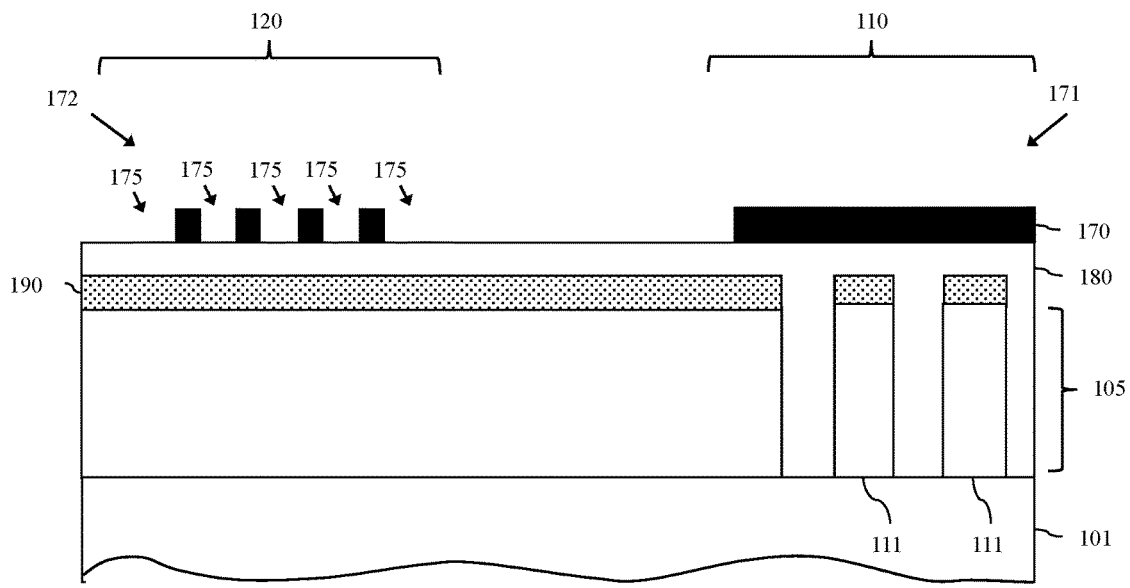

Since the second shapes 121 are to be relatively thin (i.e., are to have a second width 122 that is shorter than the first width 112 of the first shapes 111) and/or are to have a relatively short pitch (i.e., a second pitch 123 that is shorter than the first pitch 113 of the first shapes 111), this patterning process can be performed, for example, using a sidewall image transfer (SIT) process. Specifically, a second mask layer 170 and, particularly, an amorphous silicon mask layer can be deposited onto the sacrificial layer 180, for example, by a chemical vapor deposition (CVD) process or physical vapor deposition (PVD) process (see FIG. 9). Next, a dielectric layer 160 can be deposited onto the second mask layer 170 using, for example, a CVD process, a PVD process, or any other suitable deposition process (see FIG. 10). It should be noted that, if the degradable material is a thermodegradable material, regardless of the type of deposition processes used, the temperature of this deposition process should be lower than the degrade temperature of the degradable material of the sacrificial layer 180. The dielectric layer 160 can then be patterned (e.g., using a lithographic patterning technique, as described in detail above) so that the only remaining portion of the dielectric layer 160 is aligned above the first region 110 of the specific layer 105 (see FIG. 11) to protect the first region 110, which has already been patterned with the first shapes 111. After the dielectric layer 160 is formed, a mandrel layer can be deposited and patterned (e.g., using a lithographic patterning technique, as described in detail above) to form mandrels 161 (i.e., to form elongated rectangular-shaped bodies) on the second mask layer 170 aligned above the second region 120 of the specific layer 105 (see FIG. 12). Next, dielectric sidewall spacers 162 can be formed on the sidewalls of the mandrels 161 (see FIG. 13). That is, a relatively thin conformal dielectric layer can be deposited over the mandrels 161, on the exposed portions of the second mask layer 170 and over the remaining portion of the dielectric layer 160. Then, a directional etch process can be performed so as to remove the conformal dielectric layer from horizontal surfaces, leaving behind only dielectric sidewall spacers 162 on vertical surfaces. It should be noted that the dielectric sidewall spacers 162 and the dielectric layer 160 can be made of the same dielectric material (e.g., a silicon oxide or other suitable dielectric layer). After the dielectric sidewall spacers 161 are formed, the mandrels 161 can be selectively removed (e.g., using an etch process that is selective for the material of the mandrels 161 over the material(s) of the dielectric sidewall spacers 162 and dielectric layer 160 (see FIG. 14). Once the mandrels 161 are removed, an anisotropic etch process (e.g., an anisotropic RIE process) can be performed to transfer the pattern created by the dielectric sidewall spacers 162 and the remaining portion of the dielectric layer 160 into the second mask layer 170 (see FIG. 15). Then, the dielectric sidewall spacers 162 and the remaining portion of the dielectric layer 160 can be selectively removed (e.g., using a wet etch process, such as a buffered oxide etch (BOE), or any other suitable etch process). As a result, the second mask layer 170 will have a second patterned portion 172, which is aligned over the second region 120 of the specific layer 105, and a second protective portion 171, which is aligned over the first region 110 of the specific layer 105.

Figure 16:
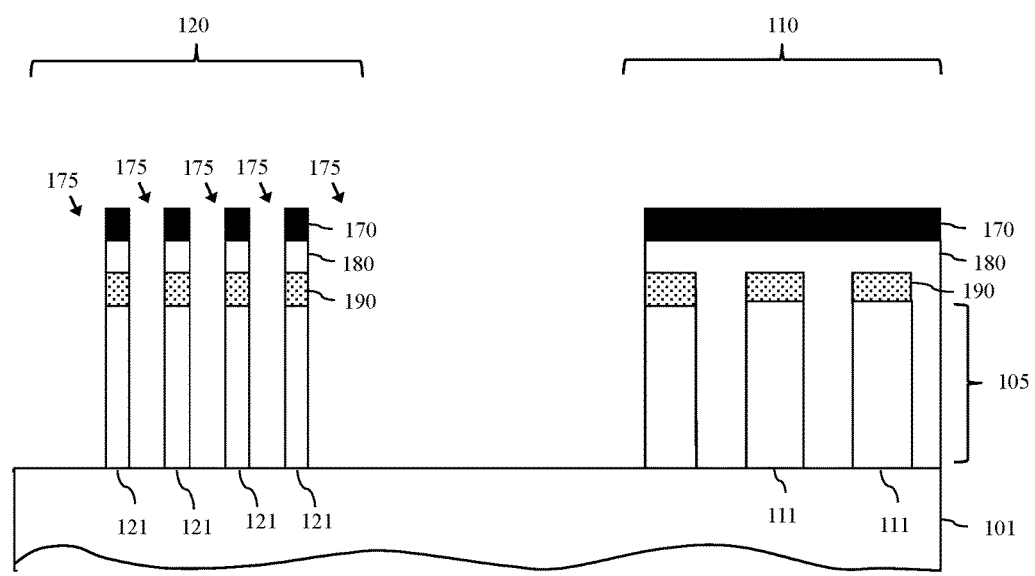

After the second mask layer 170 is formed, at least one additional anisotropic etch process (e.g., at least one additional anisotropic RIE process) can be performed to transfer the pattern of openings 175 from the second patterned portion 172 of the second mask layer 170 through the sacrificial layer 180, through the first mask layer 190 and into the second region 120 of the specific layer 105 below (412, see FIG. 16). Thus, using the second mask layer 170 and, particularly, the second patterned portion 172 of the second mask layer 170, second shapes 121 can be created within the second region 120 of the specific layer 105. It should be noted that the second protective portion 171 of the second mask layer 170 protects the first region 110 of the specific layer 105 during process 412.

Figure 17:
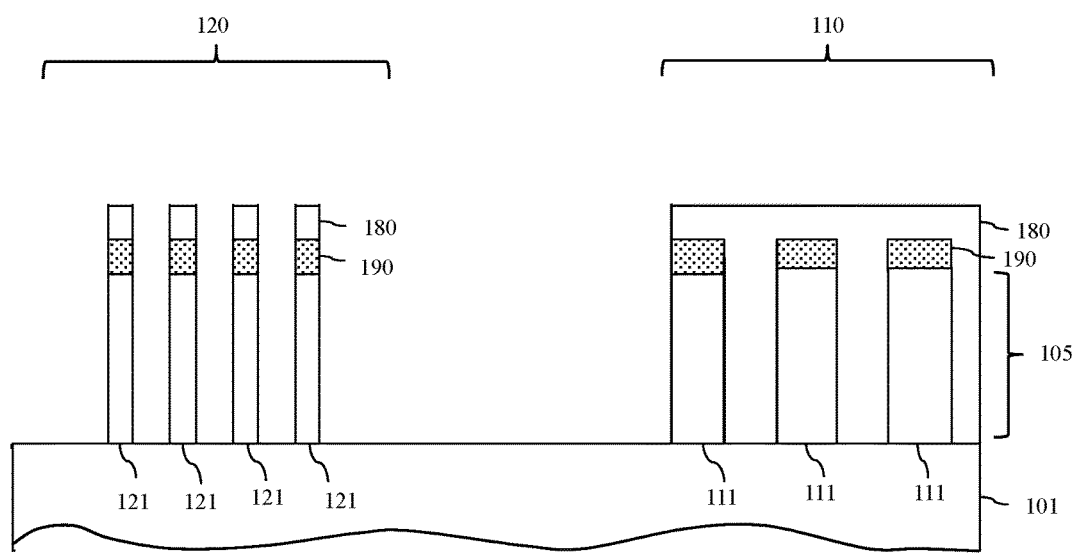

Optionally, although not shown, the remaining portions of the second mask layer 170 can be automatically etched away during formation of the second shapes 121 at process 412. Alternatively, following formation of the second shapes 121 at process 412, the remaining portions of the second mask layer 170 can be selectively removed (see FIG. 17). For example, if the second mask layer 170 is made of amorphous silicon, it can be selectively removed using a wet etch process, such as hot ammonium hydroxide, or any other suitable etch process.

Figure 18:
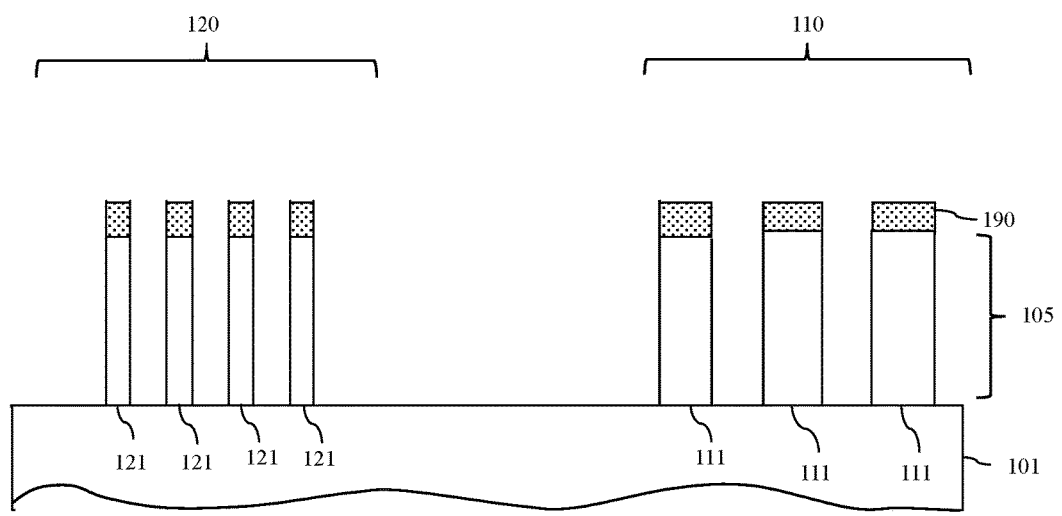

Subsequently, a process can be performed to degrade the degradable material, thereby selectively removing the sacrificial layer 180 from above the first mask layer 190 and from within the openings in the first region 110 of the specific layer 105 without impacting the profiles of either the first shapes 111 or the second shapes 121 (414, see FIG. 18). That is, if the sacrificial layer 180 is made of a thermodegradable material, the partially completed structure can be heated to a temperature, which is less than the melting of the materials of the substrate 101, specific layer 105 and first mask layer 190, for a predetermined period of time in order to degrade the material (e.g., oxidize, volatilize, burn-off or otherwise degrade the material) and, thereby selectively remove the sacrificial layer 180. For example, if the sacrificial layer 180 is made of amorphous carbon, the partially completed structure can be treated in oxygen plasma at a temperature ranging between 30° C. and 80° C., at pressure ranging between 10 mT and 100 mT and at a power ranging between 100 W and 300 W depending on the structure of first shapes 111 and the thickness of the sacrificial amorphous carbon. When exposed to oxygen plasma in this manner, the amorphous carbon will degrade and, particularly, will oxidize or burn-off into carbon dioxide or carbon monoxide. Alternatively, amorphous carbon can be degraded or otherwise volatilized or burned-off using any other suitable technique (e.g., exposure to dinitrogen dihydride (N2H2), also referred to as diimine). Alternatively, if the sacrificial layer 180 is made of a photodegradable material, the partially completed structure can be exposed to light of a particular wavelength or wavelength range, such as ultraviolet (UV) light, in order to degrade and, more particularly, to volatilize the photodegradable material.

By using separate masks and etch processes to form the first shapes 111 and second shapes 121 within the different regions 110, 120 of the specific layer 105, respectively, the methods disclosed herein allow the parameters (i.e., temperature, pressure, gas flows, RF power, time, etc.) of the etch processes 406 and 412 to be uniquely tailored (i.e., tuned) so that, when formed, the first shapes 111 and the second shapes 121 will both have the desired profiles (e.g., will have essentially vertical sidewalls). More specifically, while the first shapes 111 and the second shapes 121 are etched from the same specific layer and while the stopping depth is the same, the sizes of the openings 195 in the first mask layer 190 and the openings 175 in the second mask layer 170 are different to ensure that the first shapes 111 will have the desired first width 112 and first pitch 113 and so that the second shapes 121 will have the desired second width 122 and second pitch 123. Since the sizes of the openings 195 and 175 are different, the amount of material exposed in those openings 195 and 175 is necessarily different such that, if the same etch parameters are used at processes 406 and 412, the etch characteristics (e.g., etch rates) will vary due to the loading effect. Thus, the parameters (i.e., temperature, pressure, gas flows, RF power, time, etc.) of the etch processes 406 and 412 should be uniquely tailored (i.e., tuned) so that, when formed, the first shapes 111 and the second shapes 121 will both have the desired profiles (e.g., will have essentially vertical sidewalls).

Once the different shapes 111, 121, are formed within the different regions 110, 120 of the specific layer 105, additional processing can be performed in order to complete the IC structure (416). It should be understood that the additional processing will vary depending upon the nature of the shapes 111, 121 (e.g., as gate structures, as semiconductor fins, as silicon fins, etc.) and on the design of the IC structure being formed.

The method as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are improved methods of forming different shapes in different regions of the same specific layer during integrated circuit (IC) manufacturing. In the methods, a first mask layer and etch process can be used to form first shapes in a first region of the specific layer. Subsequently, a second mask layer and at least one additional etch process can be used to form second shapes in a second region of the specific layer. However, before the second shapes are formed, a sacrificial layer of a degradable material can be deposited onto the first mask layer and within openings in the specific layer surrounding the first shapes in order to protect the first shapes during formation of the second shapes. Then, after the second shapes are formed, a process can be initiated to degrade the material of the sacrificial layer (e.g., to oxidize, volatilize, burn-off or otherwise degrade the material) so as to selectively remove that material from surfaces of the first mask layer and the specific layer without impacting the profiles of either the first shapes or the second shapes. By using separate masks and separate etch processes to separately form the first shapes and the second shapes, the methods allow the parameters of the etch processes to be uniquely tailored so that, when formed, both the first shapes and the second shapes will have the desired profiles.

What is claimed is:

1. A method comprising:
    forming a first mask layer on a specific layer to be patterned, the first mask layer having a first patterned portion over a first region of the specific layer and having a first protective portion over a second region of the specific layer;
    performing an etch process to create first shapes within the first region;
    depositing a sacrificial layer over the first mask layer and filling openings in the specific layer created by the etch process, the sacrificial layer comprising a degradable material;
    forming a second mask layer on the sacrificial layer, the second mask layer having a second patterned portion over the second region and a second protective portion over the first region;
    performing at least one additional etch process to create second shapes within the second region; and,
    after creating the second shapes within the second region, performing a process to degrade the degradable material and remove the sacrificial layer from above the first mask layer and from within the openings.

2. The method of claim 1, the degradable material being any of a thermodegradable material and a photodegradable material.

3. The method of claim 1, the degradable material being any of amorphous carbon and a polymer.

4. The method of claim 1, the first shapes having a different width than the second shapes.

5. The method of claim 1, the first shapes having a different pitch than the second shapes.

6. The method of claim 1, each first shape comprising a first gate structure and each second shape comprising a second gate structure.

7. The method of claim 1, each first shape comprising a first semiconductor fin and each second shape comprising a second semiconductor fin.

8. A method comprising:
    using a lithographic process to form a first mask layer on a specific layer to be patterned, the first mask layer having a first patterned portion over a first region of the specific layer and having a first protective portion over a second region of the specific layer;
    performing an etch process to create first shapes within the first region;
    depositing a sacrificial layer over the first mask layer and filling openings in the specific layer created by the etch process, the sacrificial layer comprising a degradable material;
    using a sidewall image transfer process to form a second mask layer on the sacrificial layer, the second mask layer having a second patterned portion over the second region and a second protective portion over the first region;
    performing at least one additional etch process to create second shapes within the second region; and,
    after creating the second shapes within the second region, performing a process to degrade the degradable material and remove the sacrificial layer from above the first mask layer and from within the openings.

9. The method of claim 8, the degradable material being any of a thermodegradable material and a photodegradable material.

10. The method of claim 8, the degradable material being any of amorphous carbon and a polymer.

11. The method of claim 8, the first shapes having a different width than the second shapes.

12. The method of claim 8, the first shapes having a different pitch than the second shapes.

13. The method of claim 8, each first shape comprising a first gate structure and each second shape comprising a second gate structure.

14. The method of claim 8, each first shape comprising a first semiconductor fin and each second shape comprising a second semiconductor fin.

15. A method comprising:
    using a lithographic process to form a first mask layer on a semiconductor layer to be patterned, the first mask layer comprising a nitride mask layer and having a first patterned portion over a first region of the semiconductor layer and having a first protective portion over a second region of the semiconductor layer;
    performing an etch process to create first shapes within the first region;
    depositing a sacrificial layer over the first mask layer and filling openings in the semiconductor layer created by the etch process, the sacrificial layer comprising amorphous carbon;
    using a sidewall image transfer process to form a second mask layer on the sacrificial layer, the second mask layer comprising an amorphous silicon mask and having a second patterned portion over the second region and a second protective portion over the first region;
    performing additional etch processes to etch through the sacrificial layer, the first mask layer and into the semiconductor layer to create second shapes within the second region; and,
    after creating the second shapes within the second region, performing a process to degrade the amorphous carbon and remove the sacrificial layer from above the first mask layer and from within the openings.

16. The method of claim 15, the process comprising a heating process.

17. The method of claim 15, the first shapes having a different width than the second shapes.

18. The method of claim 15, the first shapes having a different pitch than the second shapes.

19. The method of claim 15, the semiconductor layer comprising a polysilicon layer, each first shape comprising a first gate structure and each second shape comprising a second gate structure.

20. The method of claim 15, the semiconductor layer comprising a silicon layer, each first shape comprising a first silicon fin and each second shape comprising a second silicon fin.

* * * * *